(12) United States Patent
Chen et al.

(10) Patent No.: US 10,591,150 B2
(45) Date of Patent: *Mar. 17, 2020

(54) INTEGRATED ELECTRICAL CONNECTOR DEVICE STRUCTURE OF LED LIGHT

(71) Applicant: XIAMEN ECO LIGHTING CO. LTD., Xiamen (CN)

(72) Inventors: Xiaobo Chen, Xiamen (CN); Maojin Zeng, Xiamen (CN); Yongjun Bao, Xiamen (CN)

(73) Assignee: XIAMEN ECO LIGHTING CO. LTD., Xiamen (CN)

( * ) Notice: Subject to any disclaimer, the term of this patent is extended or adjusted under 35 U.S.C. 154(b) by 0 days.

This patent is subject to a terminal disclaimer.

(21) Appl. No.: 16/227,804

(22) Filed: Dec. 20, 2018

(65) Prior Publication Data
US 2019/0195482 A1 Jun. 27, 2019

Related U.S. Application Data

(63) Continuation of application No. 15/508,832, filed on Mar. 3, 2017, now Pat. No. 10,197,260.

(30) Foreign Application Priority Data

Dec. 3, 2015 (CN) .......................... 2015 1 0876186

(51) Int. Cl.
*F21K 99/00* (2016.01)
*F21V 15/015* (2006.01)
(Continued)

(52) U.S. Cl.
CPC .............. *F21V 23/06* (2013.01); *F21K 9/237* (2016.08); *F21K 9/238* (2016.08); *F21V 19/001* (2013.01);
(Continued)

(58) Field of Classification Search
CPC .......... F21V 25/10; F21V 29/60; F21V 29/70; F21K 9/275; F21K 9/272; F21Y 2115/10; F21Y 2103/10
(Continued)

(56) References Cited

U.S. PATENT DOCUMENTS

2015/0345766 A1* 12/2015 Wang ...................... F21V 23/00
362/382
2017/0276339 A1* 9/2017 Chen ...................... F21V 21/002

FOREIGN PATENT DOCUMENTS

CN 105351777 A ‡ 2/2016 ............ F21V 19/001
CN 205174021 U ‡ 4/2016

* cited by examiner
‡ imported from a related application

*Primary Examiner* — Tracie Y Green
(74) *Attorney, Agent, or Firm* — Cung-Ming Shih; Lanway IPR Services

(57) ABSTRACT

An integrated electrical connector device structure of LED light includes a light source board, a supporting board a light head, and at least a conductive connector. The supporting board is set between the light source board and the light head. The conductive includes a conductive pin, a fixed part and a plug. The fixed part is fixed on the supporting board. The conductive pin is connected to the light head electrically. The plug is connected to the light source board electrically to connect the light head and the light source board electrically. The integrated electrical connector device structure of LED light owns the advantages of simple structure and easy to be assembled automatically.

9 Claims, 6 Drawing Sheets

(51) Int. Cl.
   *F21V 23/02*    (2006.01)
   *F21V 23/06*    (2006.01)
   *F21K 9/238*    (2016.01)
   *F21V 23/00*    (2015.01)
   *F21V 19/00*    (2006.01)
   *F21K 9/237*    (2016.01)
   *H05K 1/00*     (2006.01)
   *F21V 17/16*    (2006.01)
   *F21Y 105/18*   (2016.01)
   *F21Y 115/10*   (2016.01)

(52) U.S. Cl.
   CPC .......... *F21V 23/003* (2013.01); *F21V 23/005* (2013.01); *H05K 1/00* (2013.01); *F21V 17/16* (2013.01); *F21Y 2105/18* (2016.08); *F21Y 2115/10* (2016.08)

(58) Field of Classification Search
   USPC ........................................................ 313/45
   See application file for complete search history.

INTEGRATED ELECTRICAL CONNECTOR DEVICE STRUCTURE OF LED LIGHT

TECHNICAL FIELD

The present invention is related to a lighting field and more particularly related to an integrated electrical connector device structure of LED light.

BACKGROUND

With the rising of the global environmental awareness, a LED light has developed rapidly in the lighting field. A traditional LED light structure includes a light head, a driver board with driver, a heat dissipation a light source board with light source and a bub shell. Among them, the light board, the driver board and the light head use the separate way. Between the light board and the driver board; the driver board and the light head use wire welding to be electrical connection. The features of low efficiency, waste-time process, and not good to install and position. The integrated electrical connector device structure of LED light is not good at automated production. Nowadays, there is an improve plan using the connector to realize the electronic connection between the light head and the driver board; the driver board and the light source board. Because of the complicate structure of the connector, complicate process of combination and the high cost of the production, and even more about the different types of the electronic connectors between the driver board and the light board, the process of making the integrated electrical connector device structure of LED light is complex and is not good to be automated production.

SUMMARY OF INVENTION

In view of this, it is necessary to provide an integrated electrical connector device structure of LED light with a simple structure and an easy automated combination.

The technical solution for the present invention is an integrated electrical connector device structure of LED light. The integrated electrical connector device structure of LED light includes a light source board, a supporting board a light head, and at least a conductive connector. The supporting board is set between the light source board and the light head. The conductive includes a conductive pin, a fixed part and a plug. The fixed part is fixed on the supporting board. The conductive pin is connected to the light head electrically. The plug is connected to the light source board electrically to connect the light head and the light source board electrically.

Comparing with the existed technology, the integrated electrical connector device structure of LED light includes the conductive connector. The integrated electrical connector device structure of LED light includes the supporting board to fix the connector. When assembled, only need to fix the supporting board to connect the connector's conductive pins and the light head electrically. The connector's plug is connected to the light source board electrically and may connect the light head and the light source board electrically. The integrated electrical connector device structure of LED light does not need to connect the light source board, the driver board, and the light head electrically in turn when assembled. The integrated electrical connector device structure of LED light omit the middle of the installation steps of connecting the light source board and the driver board; the driver board and the light head electrically. The simple installation and not need the complex structure. The integrated electrical connector device structure of LED light owns the advantages of simple structure and easy to be assembled automatically.

DETAILED DESCRIPTION

The embodiment is to describe the present invention detailed in following description.

Figure 1:
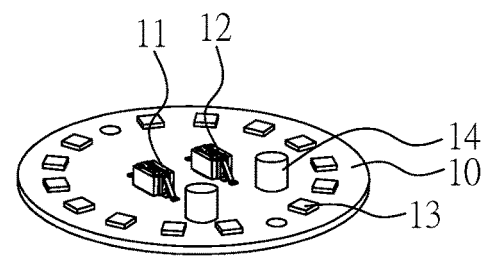
FIG. 1 is the first embodiment stereoscopic decomposition drawing for the present invention, an integrated electrical connector device structure of LED light.
Figure 1:
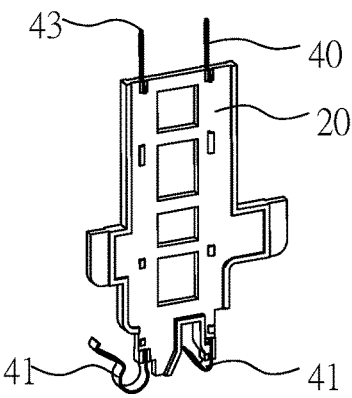
Figure 1:
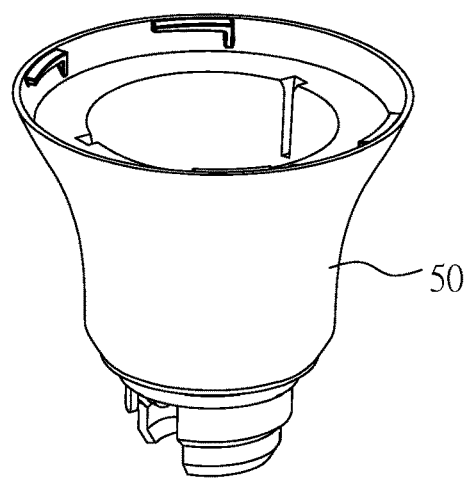
Figure 1:
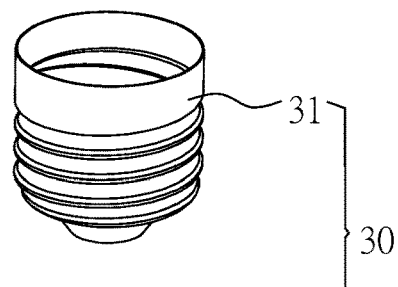
Figure 1:
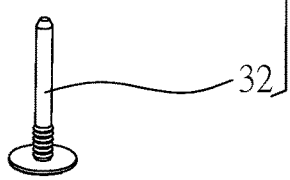

FIG. 1 illustrates a first embodiment according to the present invention, an integrated electrical connector device structure of LED light. The integrated electrical connector device structure of LED light includes a light source board (10), a supporting board (20), a light head (30), and at least a connector. (40) The supporting board (20) is set between the light source board (10) and the light head. (30) The supporting board (20) is made of insulated ingredients.

Figure 2:
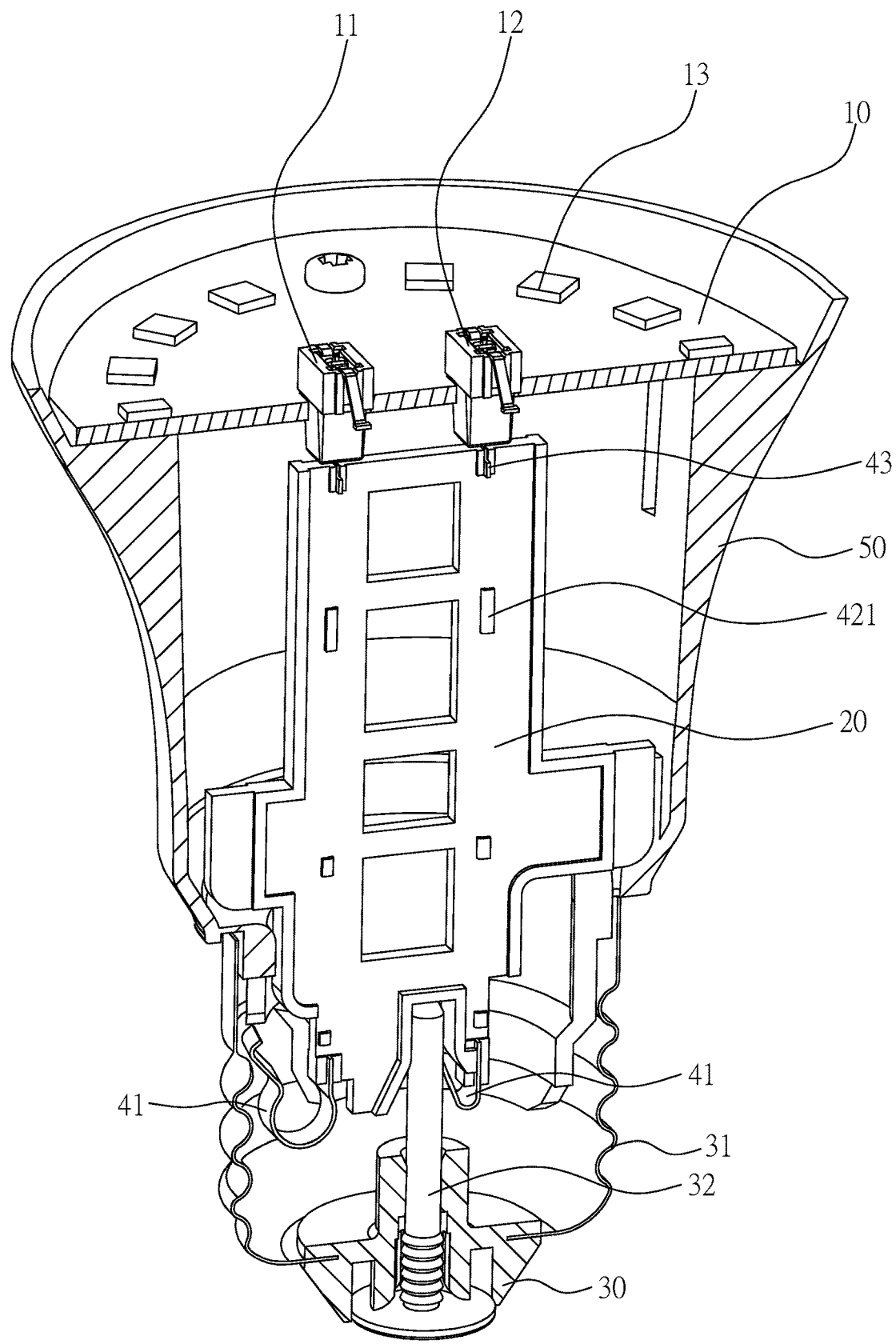
FIG. 2 is the sectioned drawing from FIG. 1 that illustrates the integrated electrical connector device structure of LED light after assembled.
Figure 3:
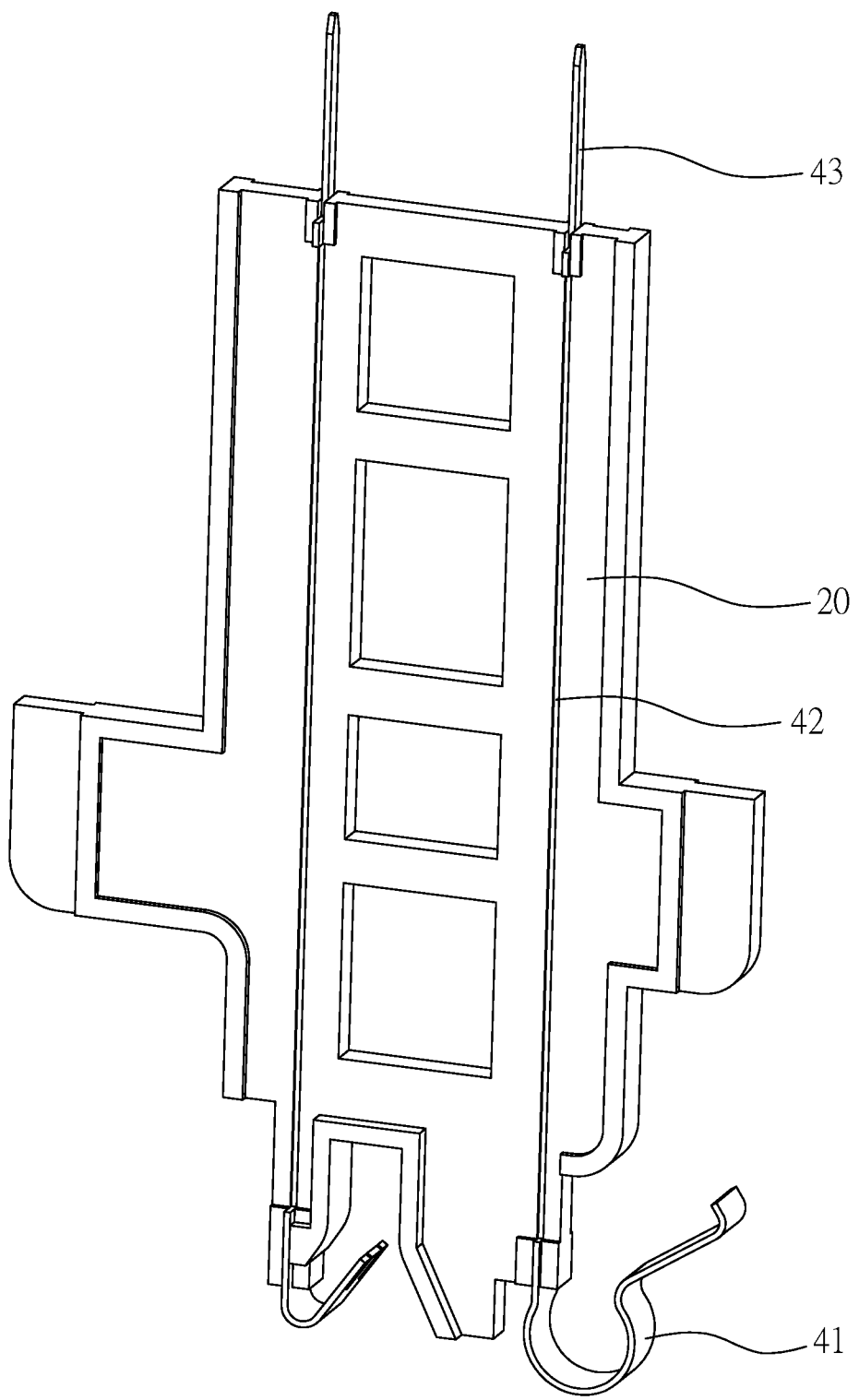
FIG. 3 is the assembly drawing from FIG. 1 that illustrates the integrated electrical connector device structure of LED light's connector and supporting board.
Figure 4:
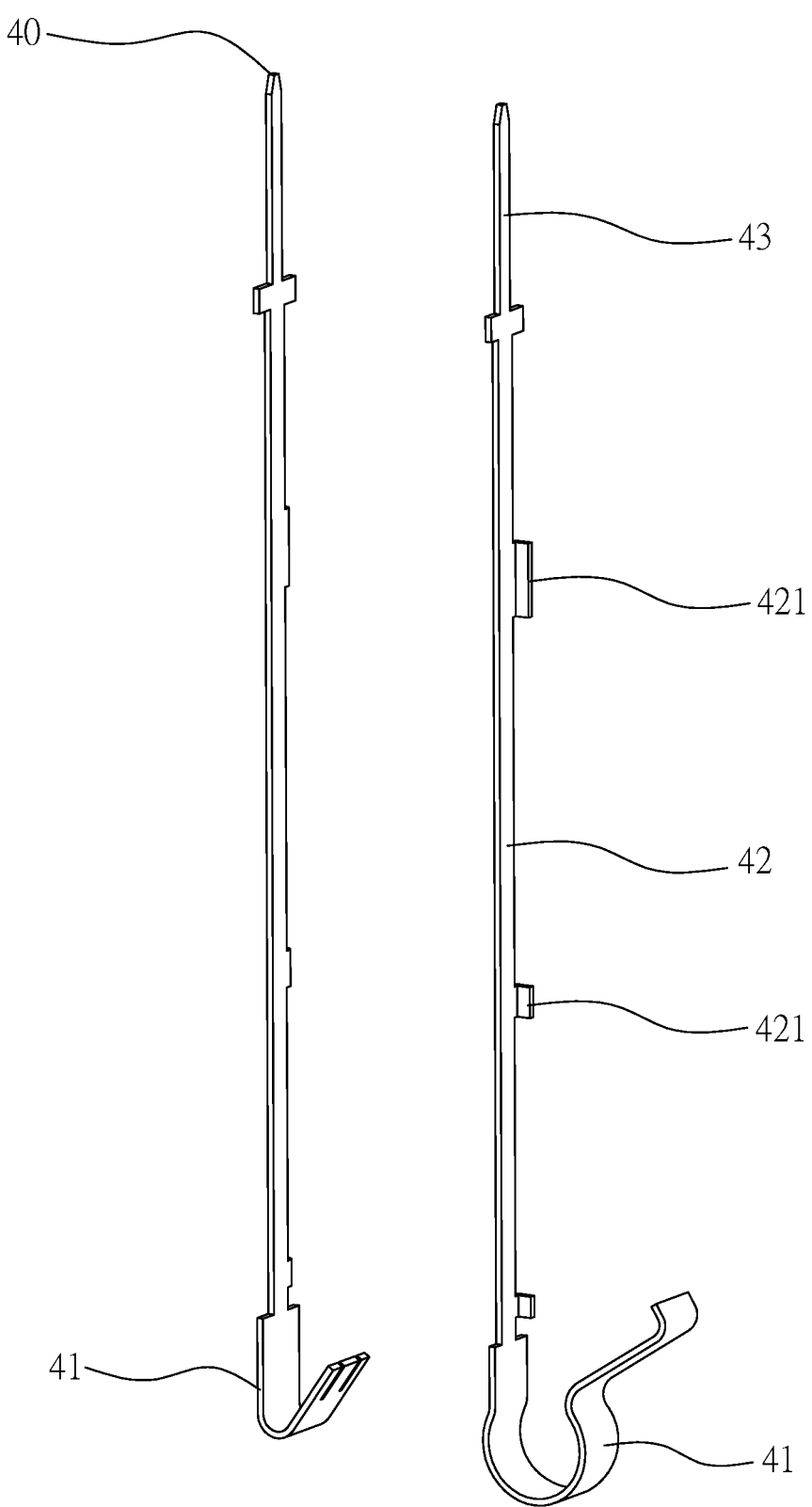
FIG. 4 is the stereoscopic drawing from FIG. 3 that illustrates the integrated electrical connector device structure of LED light.
Figure 5:
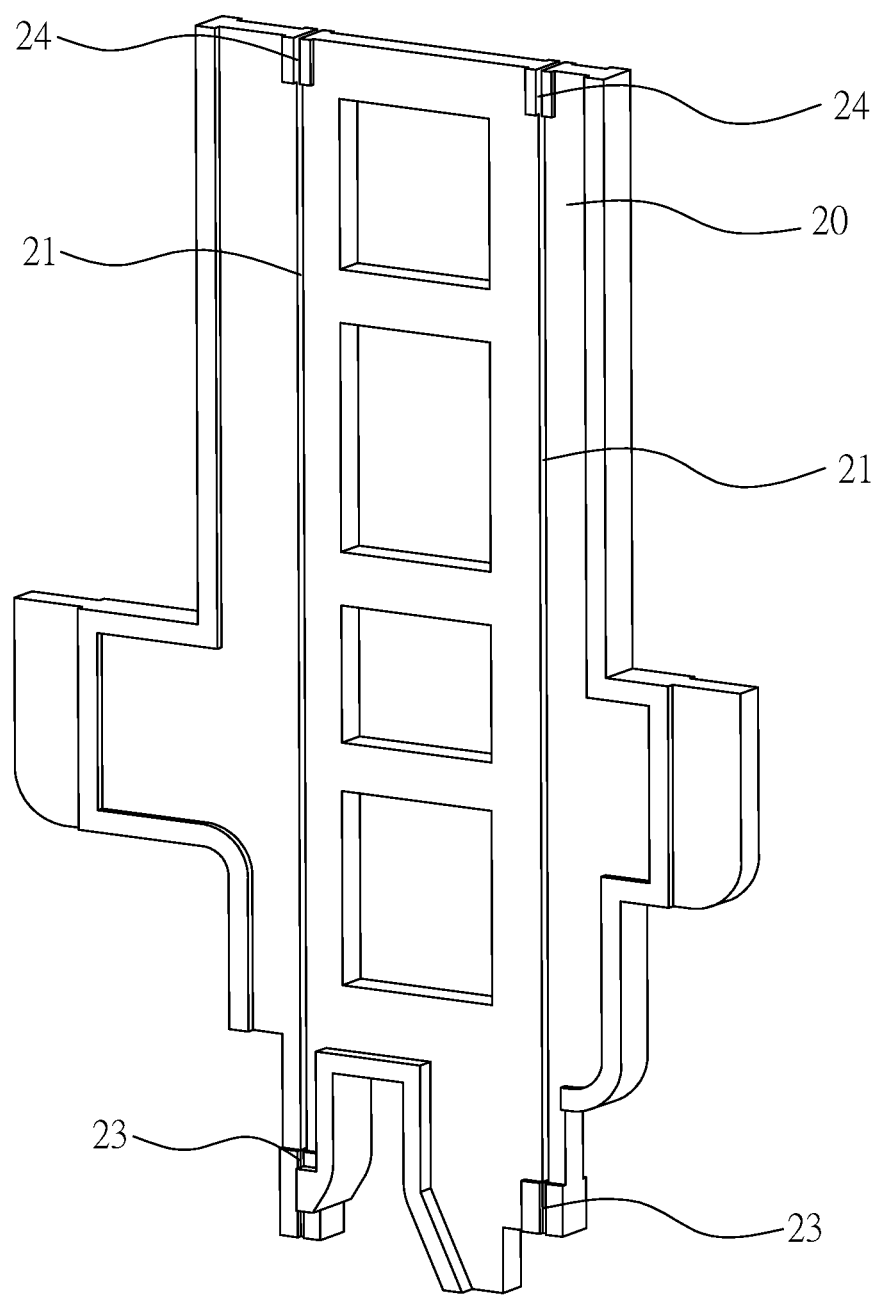
FIG. 5 is the stereoscopic drawing from FIG. 3 that illustrates the integrated electrical connector device structure of LED light's supporting board.
Figure 6:
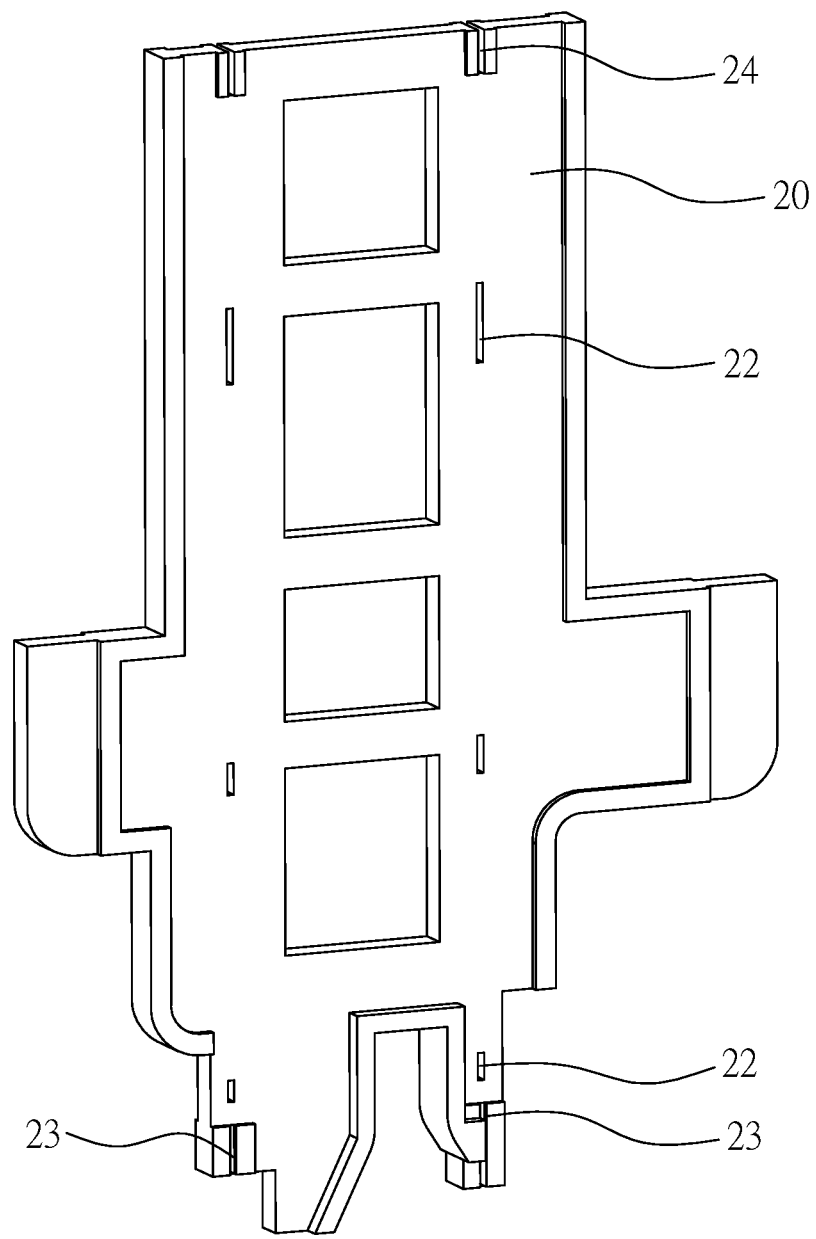
FIG. 6 is another stereoscopic drawing from FIG. 3 that illustrates the integrated electrical connector device structure of LED light's supporting board.

Please refer to the FIG. 1 and FIG. 2, the integrated electrical connector device structure of LED light includes the hollow shell shaped light cup. (50) The light board (10) is fixed on the top of the light cup. (50) The light head (30) is fixed on the bottom of the light cup. (50) The supporting board (20) is fixed in the light cup, (50)

Please refer to the FIG. 2 to FIG. 6, and each of the connector (40) includes conductive pins, a fixed part (42), and a plug (43). The fixed part (42) is fixed on the supporting board. (20) The conductive pins (41) is connected to the light head (30) electrically. The plug (43) is connected to the light source board (10) electrically to connect the light head (30) and the light source board electrically. (10) Each of the connector (40) is made of the metal slices for the whole set. The connector's (40) conductive pins (41), fixed part (42) and plug (43) are all set together. The number of the conductive pins (41) is two. The first electrode (31) and the second electrode (32) are set insulated from each other on the light head (30). Two connectors (40) are separately connected to the first electrode (31) and the second electrode (32) electrically. The structure of conductive pins (41) are made of bent metal elastic clips. In the embodiment, the light head (30) is the spiral shaped of the light head. The first electrode (31) is the structure of the metal spiral shell. The second electrode (32) is the structure of the bottom needle inserted. The first electrode (31) and the second electrode (32) set insulated from each other through the insulated ingredients.

Among them, the connectors (40) are made of the ingredients of the metal pieces. The clamps (421) are fixed on the fixed part. (42) The deduction holes (22) are fixed on the supporting part. (20) The clamps (421) are buckled in the deduction holes (22) to fix the fix part (42) on the supporting board. (20) In the embodiment, set the clamps on the fixed part (42) near the conductive pins. (41) Moreover, the supporting board (20) set the storage slot (21) related to each connector's (40) fixed part (42). The storage slots (21) are connected to the deduction holes. (22) Moreover, the driver electrical item is set on the supporting board. (20) The middle of the fixed part (42) is connected to the two ends of the driver electrical item electrically. The two ends of the fixed part (42) are separately connected to the conductive pins (41) and the plug (43) electrically.

Among them, the positioning slot (23) is set relatively to each connector's conductive pin on the supporting board. (20) The positioning slot (23) is related to the storage slot. (21) The conductive pins (41) are elastic clipping structure. One end of the conductive pins (41) is fixed in the positioning slot. (23) The other end of the conductive pins (41) is elastically connected to the light head (30) electrically.

Please refer to FIG. 1 and FIG. 2, the first terminal (11) and the second terminal (12) are set on the light source board. (10) The first terminal (11) and the second terminal (12) are separately connected to two connectors' (40) plugs (43) electrically. The LED light source (13) and the driver electrical item (14) are set on the light source board. (10) The LED light source (13) and the driver electrical item (14) passing through the first terminal (11) and the second terminal (12) are connected to the plugs (43) electrically. In the embodiment, the fixed slot (24) is set relatively to the connector's (40) plug (43) on the supporting board. (20) The fixed slot (24) is related to the storage slot. (21) One end of the plugs (43) are fixed in the fixed slot. The other end of the plugs (43) are connected to the first terminal (11) and the second terminal (12) electrically.

In conclusion, the integrated electrical connector device structure of LED light includes the connector (40) and the supporting board (20) may fix the connector. (40) When assembled, only need to fix the supporting board (20) and make the connector's (40) conductive pins (41) be related to the light head (30) electrically. The connector's (40) plug (43) is connected to the light source board (10) may connect the light head (30) and the light source board (10) electrically. The integrated electrical connector device structure of LED light does not need to connect the light source board, the driver board, and the light head electrically in turn when assembled. The integrated electrical connector device structure of LED light omit the middle of the installation steps of connecting the light source board and the driver board; the driver board and the light head electrically. The simple installation and not need the complex structure. The integrated electrical connector device structure of LED light owns the advantages of simple structure and easy to be assembled automatically.

The statement above just for the better embodiment, not for limiting the present invention. All the modification, equal to any change and improvement that are based on the present invention's spirit and principle, may be protected in the present invention protection range.

The invention claimed is:

1. An LED light apparatus, comprising:
an electrical driver item for providing a driving current;
a light source board for receiving the driving current;
a supporting board;
a light head; and
a connector, wherein the supporting board is set between the light source board and the light head, the connector comprises a conductive pin and a fixed part, the fixed part is fixed on the supporting board, the conductive pin is connected to the light head electrically, the connector is connected to the light source board electrically for electrically connecting two electrodes of the light head and the light source board.

2. The LED light apparatus of claim 1, wherein conductive pins and the fixed part of the connector are all set together, the two electrodes comprise a first electrode and a second electrode set insulated from each other on the light head.

3. The LED light apparatus of claim 2, wherein a first terminal and a second terminal are set on the light source board, the first terminal is connected to the connector.

4. The LED light apparatus of claim 1, wherein the connector is made of metal material, the connector is fixed with a clamps on the fixed part, the supporting board has a deduction holes, and the clamps is buckled in the deduction holes.

5. The LED light apparatus of claim 4, wherein the supporting board has a storage slot for placing the fixed part of the connector.

6. The LED light apparatus of claim 1, wherein a positioning slot is set relatively to the conductive pin of the connector on the supporting board, the conductive pins are of the connector is an elastic clipping structure, one end of the conductive pins is fixed in the positioning slot, the other end of the conductive pins is elastically connected to the light head.

7. The LED light apparatus of claim 3, wherein a LED light source and a driver are set on the light source board, the LED light source and the driver are electrically connected to the plug of the connector via the first terminal.

8. The LED light apparatus of claim 1, further comprising a hollow shell shaped light cup, the light source board is fixed on top of the hollow shell shaped light cup, the light head is fixed on the bottom of the hollow shell shaped light cup, the supporting board is fixed in the hollow shell shaped light cup.

9. The LED light apparatus of claim 1, wherein a driver is set on the supporting board, the fixed part is connected to the driver.

* * * * *